(12) United States Patent
Doris et al.

(10) Patent No.: US 7,291,886 B2
(45) Date of Patent: Nov. 6, 2007

(54) HYBRID SUBSTRATE TECHNOLOGY FOR HIGH-MOBILITY PLANAR AND MULTIPLE-GATE MOSFETS

(75) Inventors: Bruce B. Doris, Brewster, NY (US); Meikei Ieong, Wappingers Falls, NY (US); Edward J. Nowak, Essex Junction, VT (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/872,605

(22) Filed: Jun. 21, 2004

(65) Prior Publication Data

US 2005/0280121 A1   Dec. 22, 2005

(51) Int. Cl.
*H01L 27/01* (2006.01)
*H01L 27/12* (2006.01)
(52) U.S. Cl. ...................... 257/350; 257/351
(58) Field of Classification Search ........ 257/347–354; 438/150
See application file for complete search history.

(56) References Cited

U.S. PATENT DOCUMENTS

| | | | |
|---|---|---|---|
| 6,204,098 B1 * | 3/2001 | Anceau | 438/149 |
| 6,870,226 B2 * | 3/2005 | Maeda et al. | 257/347 |
| 2005/0116290 A1 * | 6/2005 | de Souza et al. | 257/347 |
| 2006/0049460 A1 * | 3/2006 | Chen et al. | 257/347 |

* cited by examiner

*Primary Examiner*—Hung Vu
(74) *Attorney, Agent, or Firm*—Scully, Scott, Murphy & Presser, P.C.; Ido Tuchman, Esq.

(57) ABSTRACT

A hybrid substrate having a high-mobility surface for use with planar and/or multiple-gate metal oxide semiconductor field effect transistors (MOSFETs) is provided. The hybrid substrate has a first surface portion that is optimal for n-type devices, and a second surface portion that is optimal for p-type devices. Due to proper surface and wafer flat orientations in each semiconductor layers of the hybrid substrate, all gates of the devices are oriented in the same direction and all channels are located on the high mobility surface. The present invention also provides for a method of fabricating the hybrid substrate as well as a method of integrating at least one planar or multiple-gate MOSFET thereon.

30 Claims, 6 Drawing Sheets

HYBRID SUBSTRATE TECHNOLOGY FOR HIGH-MOBILITY PLANAR AND MULTIPLE-GATE MOSFETS

FIELD OF THE INVENTION

The present invention relates to complementary metal oxide semiconductor (CMOS) device technology, and more particularly to CMOS structures and processes for use in high-performance CMOS applications. In particular, the present invention provides a hybrid substrate having a high-mobility surface for use with planar and multiple gate metal oxide semiconductor field effect transistors (MOSFETs).

BACKGROUND OF THE INVENTION

CMOS device performance can be improved by reducing the gate length and/or by increasing the carrier mobility. To reduce the gate length, the device structure must have good electrostatic integrity. It is known that single-gate ultra-thin body MOSFETs, and multiple-gate MOSFETs, such as FinFET and tri-gate structures, have better electrostatic property compared to conventional bulk CMOS devices.

Co-assigned U.S. application Ser. No. 10/604,097, filed Jun. 26, 2003, discloses a process to integrate both planar ultra-thin body SOI MOSFET, and FinFET devices on the same wafer. In accordance with this disclosure, the structure is fabricated by a method that includes the steps of providing a SOI structure comprising at least a top semiconductor layer located on a buried insulating layer, the top semiconductor layer having at least one patterned hard mask located in a FinFET region of the structure and at least one patterned hard mask located in a FET region of the structure; protecting the FET region and trimming the at least one patterned hard mask in the FinFET region; etching exposed portions of the top semiconductor that are not protected with the hard mask stopping on the buried insulating layer, the etching defining a FinFET active device region and a FET active device region, the FinFET active device region being perpendicular to the FET active device region; protecting the FinFET active device region and thinning the FET active device region so that the FET device region has a height that is less than the height of the FinFET active device region; forming a gate dielectric on each exposed vertical surface of the FinFET active device region, while forming a gate dielectric on an exposed horizontal surface of the FET device region; and forming a patterned gate electrode on each exposed surface of the gate dielectric.

The term "ultra-thin" is used throughout the present application to denote a thickness of about 30 nm or less. The term "tri-gate" is used throughout the present application to denote a tri-gate device that comprises three conducting channels, one top surface and two vertical surfaces of the Fin. The term "FinFET" is used throughout the present invention to denote a double gate device that comprises a tall, yet thin vertical channel region.

It is known in the art that carrier mobility depends on surface orientation. For instance, electrons are known to have a high mobility for a (100) surface orientation, but holes are known to have high mobility for a (110) surface orientation. That is, hole mobility values on a (100) surface are roughly 2×-4× lower than the corresponding electron hole mobility for this crystallographic orientation. Co-assigned U.S. application Ser. No. 10/250,241, filed Jun. 17, 2003, discloses a method to integrate these two surfaces on the same wafer such that planar MOSFETs are built on the high mobility surface. That is, nFETs are built on a (100) surface and pFETs are built on a (110) surface. In accordance with this disclosure, a hybrid substrate having a surface of different crystal orientations is provided by wafer bonding two wafers having different crystallographic orientations, masking, etching through one wafer to the other wafer to expose a surface thereof and regrowth of a semiconducting material having the same crystallographic orientation as the exposed surface.

When a tri-gate is fabricated on a standard (100) wafer with the alignment wafer flat parallel to the <110> direction, mixed surface orientation for the channels are formed if the gate is oriented in parallel to the wafer flat. See, for example, FIG. 1A. This tri-gate device structure cannot provide optimum mobility for n-type or p-type MOSFETs. An optimum n-type tri-gate FET can be obtained by fabricating an n-type tri-gate FET on a standard (100) wafer with the alignment wafer flat parallel to the <110> direction and the gate is oriented at 45 from the alignment wafer flat. See, for example, FIG. 1B. Alternatively, an optimum n-type tri-gate FET can be obtained by fabricating an n-type tri-gate FET on (100) wafer with the alignment wafer flat parallel to the <100> direction and the gate oriented parallel to the wafer flat. See, for example, FIG. 1C. An optimum p-type tri-gate FET can be obtained by fabricating a p-type tri-gate FET on (110) wafer with the alignment wafer flat parallel to the <110> direction and the gate oriented parallel to the alignment wafer flat. See, for example, FIG. 1D.

Presently, it is possible to layout the n-type FinFET and the p-type FinFET by an angle of 45° on a (100) surface oriented wafer to obtain high mobility nFETs and pFETs, such a layout, however, is not preferable using today's lithography technology. Moreover, this approach cannot simultaneously provide high mobility planar/multi-gate nFETs and pFETs. Instead, it is desirable to provide a method in which the gate of the nFET and the pFET devices are both oriented in the same direction and yet all channels are on high mobility surface for both nFET and pFET. There is no known prior art that is presently capable of achieving this requirement.

Hence, a substrate structure and a method of fabricating the same are needed to make planar and/or multiple-gated MOSFETs, such as FinFETS and tri-gate MOSFETs, in which all of the channels are oriented on high mobility surfaces with the gate at same direction.

SUMMARY OF THE INVENTION

The present invention provides a hybrid substrate which has an upper surface that has regions of different crystallographic orientation such that all channels and gates of planar and/or multiple-gated MOSFETs are oriented in the same direction, wherein the n-type devices are located on a surface orientation that enhances the performance of those types of devices and the p-type devices are located on a surface orientation that enhances the performance of those types of devices. That is, the present invention provides a hybrid substrate having an upper surface of different crystallographic orientations in which the planar and/or multiple-gated MOSFETs are integrated such that they are located on a high mobility surface. Typically, the n-type devices are built on a (100) semiconductor surface for optimal device performance and the p-type devices are built on a (110) semiconductor surface for optimal device performance.

The hybrid substrate having different crystallographic orientations in which the channels and gates of all the various devices can be oriented in the same direction can be both SOI like, or alternatively one of the surfaces can be bulk like and the other surface can be SOI like.

In broad terms, the present invention provides a hybrid substrate having high mobility crystallographic orientations at the surface thereof, which includes:

a surface comprising a second semiconductor layer and a regrown semiconductor layer, wherein said second semiconductor layer has a second crystallographic orientation and the regrown semiconductor layer has a first crystallographic orientation that differs from the second crystallographic orientation;

a liner or spacer separating at least said second semiconductor layer and said regrown semiconductor layer;

an insulating layer located beneath said second semiconductor layer; and a first semiconductor layer located beneath said insulating layer and said regrown semiconductor layer, wherein said first semiconductor layer is in contact with the regrown semiconductor layer, has a crystallographic orientation that is the same as the regrown semiconductor layer, and said first semiconductor layer and said second semiconductor layer each contain a wafer flat that are aligned to each other.

In addition to the hybrid substrate mentioned above, the present invention also relates to a high-mobility structure comprising:

a hybrid substrate containing a surface comprising a second semiconductor layer and a regrown semiconductor layer, wherein said second semiconductor layer has a second crystallographic orientation and the regrown semiconductor layer has a first crystallographic orientation that differs from the second crystallographic orientation; a liner or spacer separating at least said second semiconductor layer and said regrown semiconductor layer; an insulating layer located beneath said second semiconductor layer; a first semiconductor layer located beneath said insulating layer and said regrown semiconductor layer, wherein said first semiconductor layer is in contact with the regrown semiconductor layer, and has a crystallographic orientation that is the same as the regrown semiconductor layer; and Planar or multiple-gate MOSFET devices present on both said second semiconductor layer and said regrown semiconductor layer, wherein said devices have channels and gates that are oriented in the same direction and are present on a surface that is optimal for said MOSFET device.

The present invention also provides a method of forming the hybrid substrate mentioned above as well as a method for integrating planar and/or multiple-gate MOSFETs on the hybrid substrate.

The hybrid substrate is provided by the steps of:

forming a structure comprising a first semiconductor layer of a first crystallographic orientation with a first wafer flat and a second semiconductor layer of a second crystallographic orientation with a second wafer flat separated by an insulating layer, wherein said first crystallographic orientation differs from the second crystallographic orientation, and second semiconductor layer is located atop said first semiconductor layer and the wafer flat on each semiconductor layers are in the same crystallographic direction as the surface;

protecting a first portion of the structure to define a first device area, while leaving a second portion of the structure unprotected, said unprotected portion of the structure defining a second device area;

etching said unprotected portion of the structure to expose a surface of the first semiconductor layer;

regrowing a semiconductor material on said exposed surface of the first semiconductor layer, said semiconductor material having a crystallographic orientation that is the same as the first crystallographic orientation; and planarizing the structure containing the semiconductor material so that an upper surface of the second semiconductor layer is substantially planar with an upper surface of the semiconductor material.

For a standard (100) wafer with wafer flat parallel to <110> direction, the wafer is rotated 45° such that the wafer flat is aligned to a (110) wafer with wafer flat parallel to <110> direction by 45°. Alternatively, a (100) wafer with wafer flat parallel to the <100> direction is aligned to a (110) wafer with wafer flat parallel to <110> direction.

In some embodiments of the present invention, a buried oxide region is formed by ion implantation and annealing after said planarizing step is performed.

Planar and/or multiple-gate MOSFETs are then formed on the upper surface of the second and regrown semiconductor material. Specifically, a method of forming a high mobility semiconductor structure is provided that comprises:

providing a hybrid substrate containing a surface comprising a second semiconductor layer and a regrown semiconductor layer, wherein said second semiconductor layer has a second crystallographic orientation and the regrown semiconductor layer has a first crystallographic orientation that differs from the second crystallographic orientation; a liner or spacer separating at least said second semiconductor layer and said regrown semiconductor layer; an insulating layer located beneath said second semiconductor layer; a first semiconductor layer located beneath said insulating layer and said regrown semiconductor layer, wherein said first semiconductor layer is in contact with the regrown semiconductor layer, and has a crystallographic orientation that is the same as the regrown semiconductor layer; and forming planar or multiple-gate MOSFETs on both said second semiconductor layer and said regrown semiconductor layer, wherein said planar or multiple-gate MOSFETs have channels and gates that are oriented in the same direction and are present on a surface that is optimal for said MOSFET.

DETAILED DESCRIPTION OF THE INVENTION

Figure 1A:
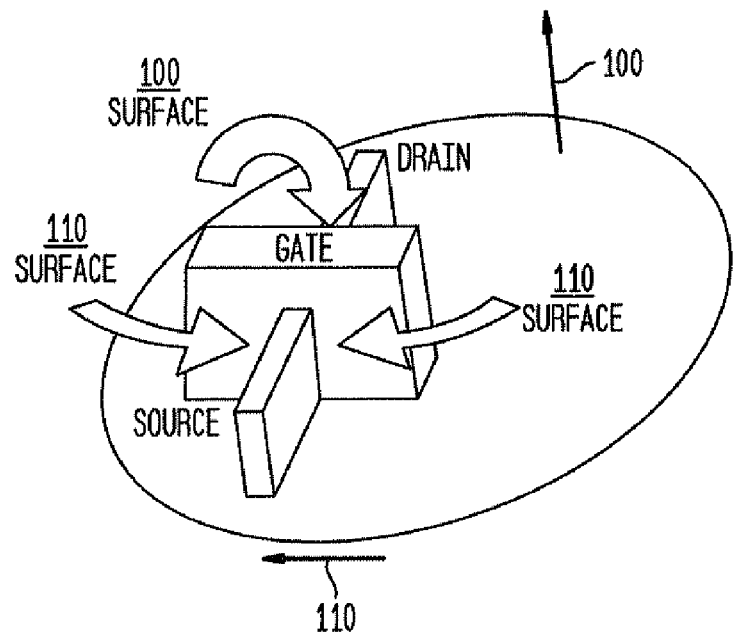
FIGS. 1A-1D are pictorial representations illustrating tri-gate structures fabricated on standard semiconductor wafers.
Figure 1B:
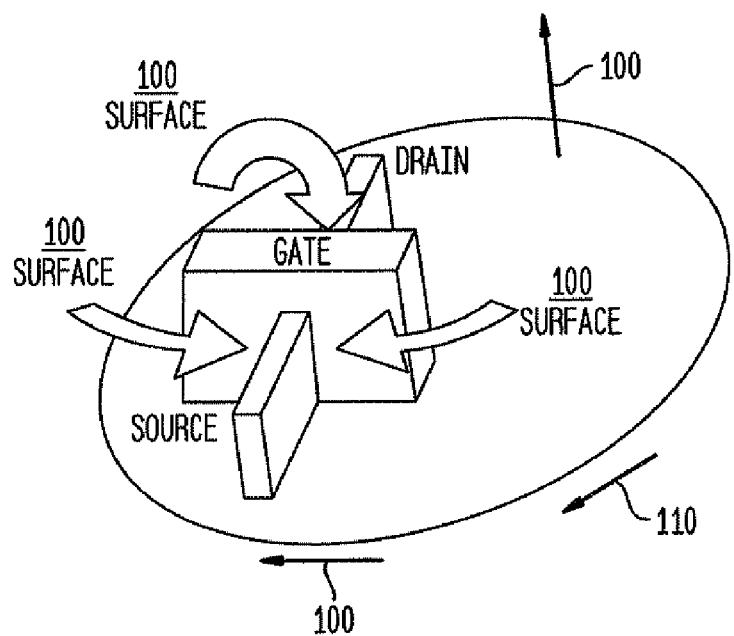
Figure 1C:
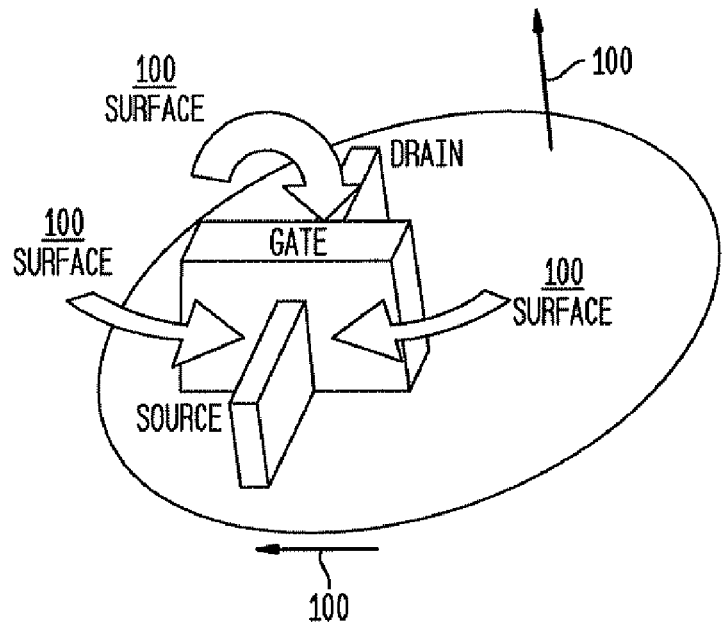
Figure 1D:
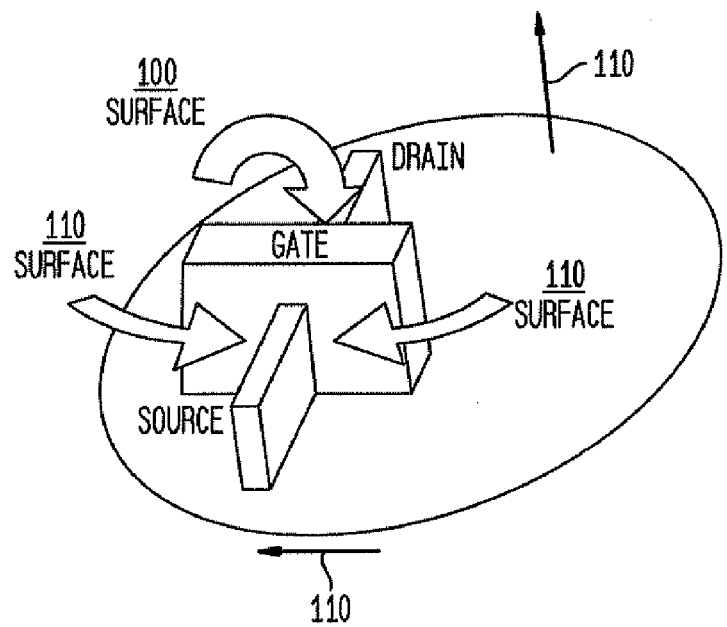

The present invention, which provides a hybrid substrate for high-mobility planar and/or multiple-gate MOSFETs and a method of forming the hybrid substrate as well as the devices thereon, will now be described in more detail by referring to the drawings that accompany the present application.

Figure 2A:
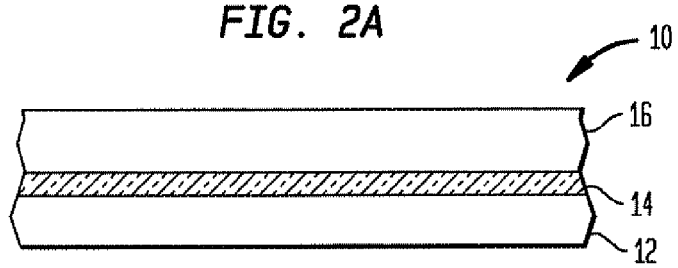
FIGS. 2A-2I are pictorial representations (through cross sectional views) illustrating basic processing steps used in the present invention to fabricate a hybrid substrate having a high mobility surface in which planar and/or multiple-gate MOSFETs are built upon.

FIG. 2A illustrates the initial substrate that is employed in the present invention. As shown, the initial substrate 10 of the present invention comprises a first (i.e., bottom) semiconductor layer 12, an insulating layer 14, and a second (i.e., top) semiconductor layer 16. The initial substrate may further include an optional semiconductor layer (not shown) that is located beneath the first (i.e., bottom) semiconductor layer. In this optional initial substrate, another insulating layer separates the first (i.e., bottom) semiconductor layer from the optional semiconductor layer.

The first semiconductor layer 12 is comprised of any semiconductor material including, for example, Si, SiC, SiGe, SiGeC, Ge, Ge alloys, GaAs, InAs, InP as well as other III/V or II/VI compound semiconductors. The first semiconductor layer 12 may also comprise a silicon-on-insulator (SOI) layer of a preformed SOI substrate or a layered semiconductor such as, for example, Si/SiGe. The first semiconductor layer 12 is also characterized as having a first crystallographic orientation that can be (100) or (110). When the first semiconductor layer 12 has a (110) orientation, an alignment wafer flat is provided in the <110> direction. When the first semiconductor layer 12 has a (100) crystal orientation, an alignment wafer flat is provided in the <100> direction. The first semiconductor layer may be a strained layer, an unstrained layer or it may contain a combination of strained/unstrained layers. In a preferred embodiment, the first semiconductor layer 12 is a Si-containing substrate having a (110) orientation with a wafer flat in the <110> direction. The wafer flat is formed in the semiconductor layer using standard techniques that are well known to those skilled in the art.

The thickness of the first semiconductor layer 12 may vary depending on the initial starting wafers used to form the substrate shown in FIG. 2A. Typically, however, the first semiconductor layer 12 has a thickness from about 5 nm to about 200 μm, with a thickness from about 5 to about 100 nm being more typical.

The insulating layer 14 that is present between the first semiconductor layer 12 and the second semiconductor layer 16 can be an oxide, nitride, oxynitride or any combination thereof. Preferably, the insulating layer 14 is an oxide. The thickness of insulating layer 14 may vary depending again on the initial wafers used in creating the substrate shown in FIG. 2A. Typically, however, the insulating layer 14 has a thickness from about 1 to about 500 nm, with a thickness from about 5 to about 100 nm being more typical.

The second semiconductor layer 16 is comprised of any semiconductor material including, for example, Si, SiC, SiGe, SiGeC, Ge, Ge alloys, GaAs, InAs, InP as well as other III/V or II/VI compound semiconductors. The second semiconductor layer 16 may also comprise a silicon-on-insulator (SOI) layer of a preformed SOI substrate or a layered semiconductor such as, for example, Si/SiGe. The second semiconductor layer 16 can be comprised of the same semiconductor material as the first semiconductor layer 12 with the proviso that the second semiconductor layer 16 has a second crystallographic orientation that is different from the first semiconductor layer 12. Thus, the second semiconductor layer 16 has a second crystallographic orientation that can be (100) or (110), which differs from the crystallographic orientation of the first semiconductor layer 12.

When the first semiconductor layer 12 has a (110) orientation, the second semiconductor layer 16 would have a (100) orientation. Likewise, when the first semiconductor layer 12 has a (100) crystal orientation, the second semiconductor layer 16 has a (110) crystallographic orientation. The second semiconductor layer 16 may be a strained layer, an unstrained layer or it may contain a combination of strained/unstrained layers. Preferably, the second semiconductor layer 16 is a Si-containing layer having a (100) crystal orientation with an alignment wafer flat in the <100> direction.

The thickness of the second semiconductor layer 16 may vary depending on the initial starting wafers used to form the substrate shown in FIG. 2A. Typically, however, the second semiconductor layer 16 has a thickness from about 5 to about 500 nm, with a thickness from about 5 to about 100 nm being more typical.

The substrate 10 shown in FIG. 2A is obtained by a layer transfer process in which two wafers and thermal bonding are employed. Specifically, the layer transfer is achieved by bring two wafers into intimate contact with each, optionally applying an external force to the contacted wafers, and then heating the two contacted wafers under conditions that are capable of bonding the two wafers.

In accordance with the present invention, one of the wafers contains at least the first semiconductor layer 12 and the other contains at least the second semiconductor layer 16. Also, at least one of the wafers includes an insulating layer that becomes insulating layer 14 shown in FIG. 2A. In some embodiments, both wafers can include an insulating layer. In the present invention, layer transfer is achieved by semiconductor/insulating bonding or insulating/insulating bonding. Bulk semiconductor wafers can be used, SOI wafers can be used or a combination of bulk and SOI can be employed. In some embodiments, one of the wafers used in layer transfer includes an implant region, such as a hydrogen implant region, that can be used to split a portion of at least one of the wafers during the layer transfer process.

Figure 3A:
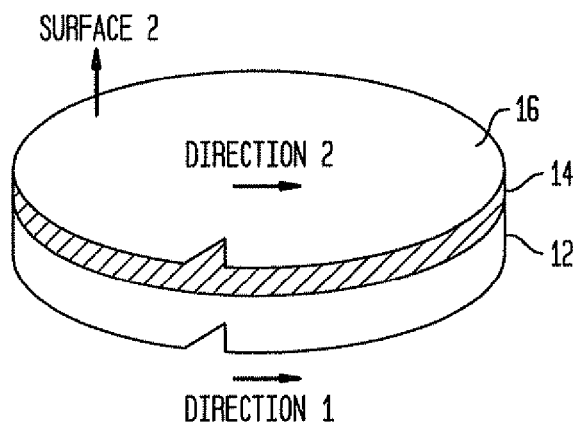
FIGS. 3A-3B are pictorial representations (through 3-D side views) of initial substrates that can be employed in the present invention.
Figure 3B:
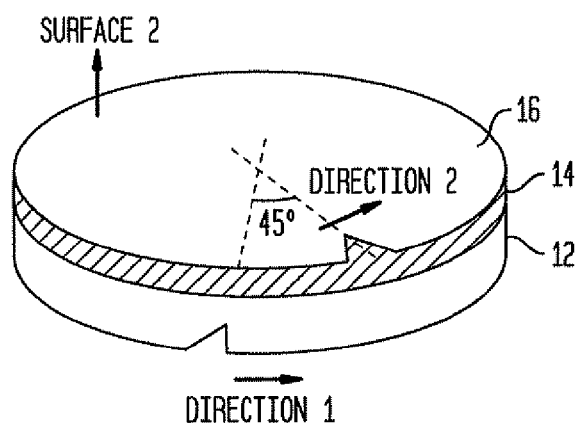

The contact step mentioned above differs from conventional contact steps used in layer transfer in that the wafer including the second semiconductor layer 16 is rotated 45° from the normal wafer configuration (normal (100) wafer configuration has wafer flat parallel to <110> direction). This rotation ensures that the alignment wafer flat of the second semiconductor layer 16 is aligned to the alignment wafer flat of the first semiconductor layer at proper rotation. See, FIG. 3A, for example. Alternatively, the wafer flat for (100) wafer should be located parallel to <100> direction and aligned to (110) wafer with wafer flat parallel to <110> direction. See, for example, FIG. 3B. This step can ensure that MOSFETs, including planar and multiple-gate FETs, fabricated on this hybrid substrate will have channels always located on high mobility planes.

The heating step used during layer transfer may be performed in the presence or absence of an external force. The heating step is typically performed in an inert ambient at a temperature from about 200° to about 1050° C. for a time period from about 2 to about 20 hours. More preferably, bonding is performed at a temperature from about 200° to about 400° C. The term "inert ambient" denotes an atmosphere which does not react with any of the semiconductor wafers. Illustrative examples of inert ambients include, for example, He, Ar, $N_2$, Xe, Kr, or a mixture thereof can be employed. A preferred ambient used for bonding is $N_2$.

Following the layer transfer process, a planarization process (not shown) can be employed to remove some material from one of the semiconductor wafers. The planarization step is particularly employed when two SOI wafers are used in the layer transfer process.

Figure 2B:
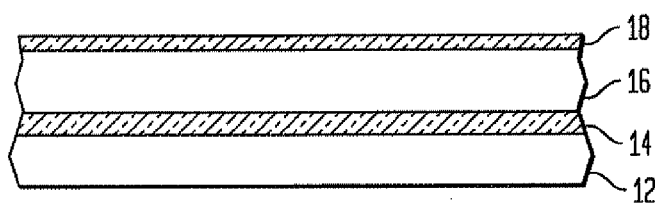

Next, a pad stack 18 comprising at least one insulating material is formed atop the second semiconductor layer 16 shown in FIG. 2A providing the structure shown in FIG. 2B. The pad stack 18 can be composed of an oxide, nitride, oxynitride or any combination thereof. In one embodiment, for example, the pad stack 18 can be a $Si_3N_4$ layer formed atop a $SiO_2$ layer. The pad stack 18 is formed by a deposition process and/or a thermal growth process. The deposition process includes, for example, chemical vapor deposition (CVD), plasma-enhanced chemical vapor deposition (PECVD), atomic layer deposition, chemical solution deposition and other like deposition processes. The thermal growth process includes an oxidation, nitridation, oxynitridation or a combination thereof. In the preferred pad stack 18 mentioned above, the $SiO_2$ layer is formed by an oxidation process and the $Si_3N_4$ is formed via deposition.

The pad stack 18 can have a variable thickness that is dependent on the type of insulating material employed as well as the number of insulating layers within the stack. Typically, and for illustrative purposes, the pad stack 18 has a thickness from about 1 to about 200 nm, with a thickness from about 5 to about 50 nm being more typical.

Figure 2C:
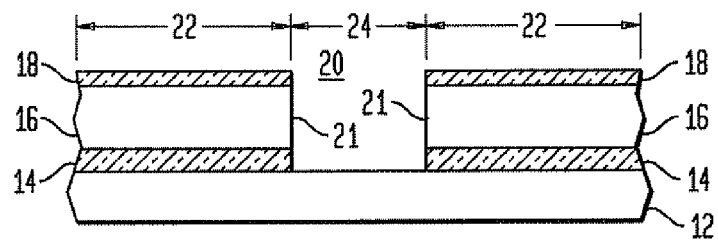

A mask (not shown) is then formed on a predetermined portion of the structure shown in FIG. 2B so as to protect a first portion of the structure, while leaving a second portion of the structure unprotected. The protected portion of the structure defines a first device region 22, whereas the unprotected portion of the structure defined a second device region 24. The various device regions are shown, for example, in FIG. 2C.

In one embodiment of the present invention, the mask is formed on a predetermined portion of the pad stack 18 by first applying a photoresist mask to the entire surface of the structure. After application of the photoresist mask, the mask is patterned by lithography, which includes the steps of exposing the photoresist to a pattern of radiation and developing the pattern utilizing a resist developer. Alternatively, and when the pad stack 18 includes multiple insulators in which the upper layer thereof is a nitride or oxynitride, the upper layer serves as the mask used in defining the different device regions. In this embodiment, the upper nitride or oxynitride layer of the pad stack 18 is patterned by lithography and etching. The upper nitride or oxynitride layer of the pad stack 18 may, in some instances, be removed after defining the second device region.

After providing the mask (not shown) to the structure shown in FIG. 2B, the structure is subjected to one or more etching steps so as to expose a surface of the underlying first semiconductor layer 12. The resultant structure that is formed after the one or more etching steps have been performed and after mask removal is shown, for example, in FIG. 2C. Specifically, the one or more etching steps used at this point of the present invention removes the unprotected portion of the pad stack 18, as well as an underlying portion of the second semiconductor layer 16, and a portion of the insulating layer 14 that separates the first semiconductor layer 12 from the second semiconductor layer 16.

The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the pad stack 18, the second semiconductor layer 16 and the insulating layer 14 in the second semiconductor device region 24. Note that the etching step provides an opening 20 having sidewalls 21. Despite showing a structure having one opening, the present invention also contemplates other structures in which a plurality of such openings is formed. In such an embodiment, multiple second device regions and multiple first device regions can be formed.

Figure 2D:
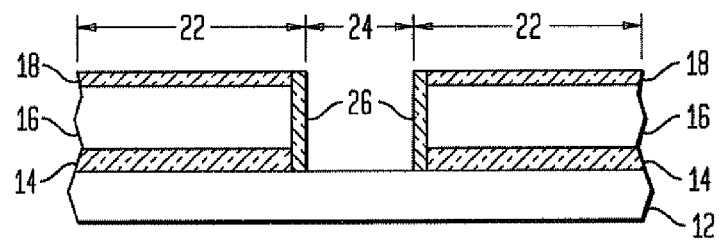

After etching, the mask is removed from the structure utilizing a conventional resist stripping process and then a liner or spacer 26 is formed on the exposed sidewalls 21. The liner or spacer 26 is formed by deposition and etching. The liner or spacer 26 is comprised of an insulating material such as, for example, an oxide, nitride, oxynitride or any combination thereof. The structure including liner or spacer 26 formed on each sidewall 21 of opening 20 is shown in FIG. 2D.

After forming the liner or spacer 26, a semiconductor material 28 is formed on the exposed surface of the first semiconductor layer 12. In accordance with the present invention, semiconductor material 28 has a crystallographic orientation that is the same as the crystallographic orientation of the first semiconductor layer 12. The resultant structure is shown, for example, in FIG. 2E.

The semiconductor material 28 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 28 is comprised of Si. In other preferred embodiments, the semiconductor material is a strained Si layer that is located atop a relaxed SiGe alloy layer. In the present invention, semiconductor material 28 may be referred to as a regrown semiconductor material or layer.

Figure 2E:
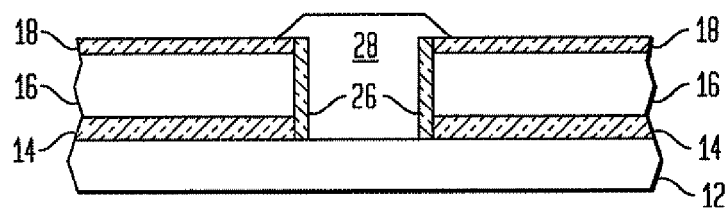
Figure 2F:
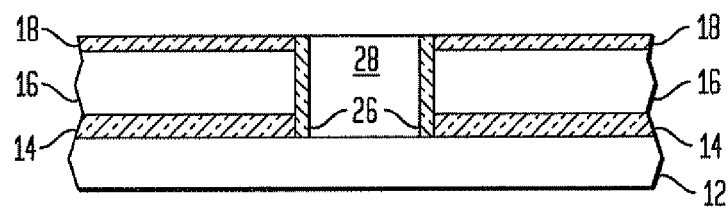

Next, the structure shown in FIG. 2E is subjected to a planarization process such as chemical mechanical polishing (CMP) or grinding such that an upper surface of the semiconductor material 28 is substantially planar with an upper surface of the pad stack 18. The resultant structure formed after the first planarization process has been performed is shown, for example, in FIG. 2F.

Figure 2G:
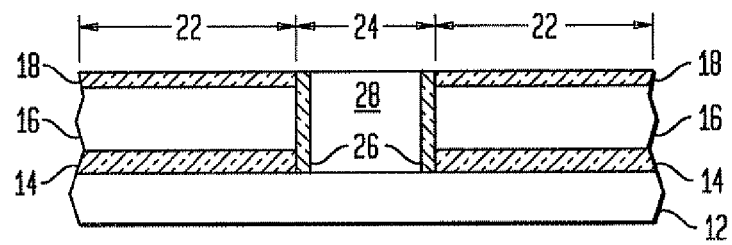

After the first planarization step, a second planarization step is performed to provide the planar structure shown in FIG. 2G. In the structure shown in FIG. 2G, the second planarization process removes the pad stack 18 from the structure. In the illustrated structure shown in FIG. 2G, the regrown semiconductor material 28 has an upper surface that is coplanar with the upper surface of the second semiconductor layer 16. Hence, these planarization steps expose the active device regions 22, 24 in which the planar and/or multiple-gate MOSFETs can be build.

Figure 2H:
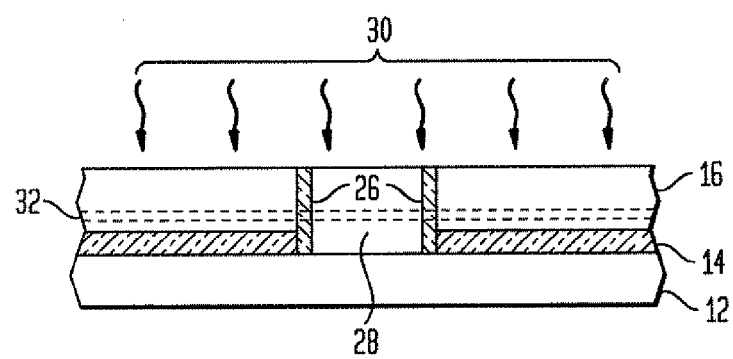

FIG. 2H shows an optional, yet highly preferred, step of the present invention in which oxygen ions 30 are implanted into the structure so as to form an implant region 32 that is rich in oxygen ions within the structure. The optional implant is performed by ion implantation using an oxygen ion dose from about $10^{15}$ to about $5 \times 10^{17}$ atoms/cm$^2$. The ion dose employed in the present invention should be sufficient for forming an implant region 32 having a sufficient concentration of oxygen ions that can be converted into a buried oxide region during a subsequent high temperature annealing step. The implant region 32 is typically formed in both the second semiconductor layer 16 and the regrown semiconductor layer 28. In some embodiments, a masked ion implantation process can be used such that the oxygen ions are implanted into either the second semiconductor layer 16 or the regrown semiconductor layer 28. The later embodiment could provide means for providing selective buried oxide regions 34 in the structure. Although oxygen ions are described and illustrated, other ions that can be used in forming an ion implant rich region for subsequent transformation into a buried insulating region can be employed.

Figure 2I:
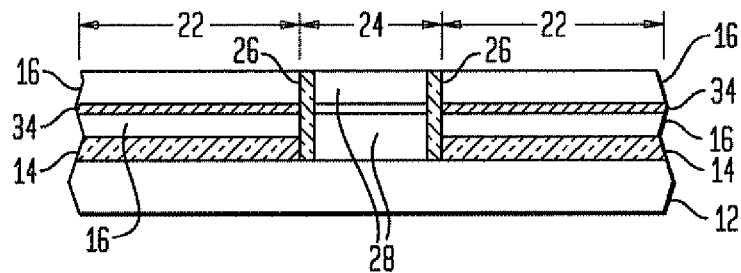

FIG. 2I shows the structure that is formed after the high temperature annealing step has been performed. In the structure shown in FIG. 2I, reference numeral 34 denotes the buried oxide region that is formed. Note that the presence of the buried oxide region 34 ensures that the both device regions, 22 and 24, are SOI like. The high temperature annealing step may be carried out in an inert ambient such as He, Ar, $N_2$, Xe, Kr, Ne or mixtures thereof, or an oxidizing ambient which includes at least one oxygen-containing gas such as, for example, $O_2$, NO, $N_2O$, ozone, air, or other oxygen-containing ambients. Alternatively, the ambient used in the high temperature annealing step can include a mixture of oxygen-containing gases and inert gases. When an ambient includes an oxygen-containing gas, the buried oxide region 34 may include a thermal oxide region, and a surface oxide that is typically stripped from atop the exposed surface of the structure.

The high temperature annealing step used in forming the buried oxide region 34 is performed at a temperature from about 1000° to about 1400° C., with a temperature from about 1200° to about 1300° C. being more highly preferred. The annealing step can be carried out for a variable time period that typically ranges from about 60 to about 3000 minutes. The annealing step may be performed at a single targeted temperature, or various ramp and soak cycles using various ramp and soak temperatures and times can be employed. The annealing step may be a rapid thermal anneal (RTA), a laser anneal or other energy sources such as electrons beams are also contemplated herein. Alternatively, a furnace anneal can be used. When a furnace anneal is employed, the annealing times are typically greater than those of RTA.

It should be noted that the hybrid substrate shown in either FIG. 2G or FIG. 2I can be used in the present invention. The hybrid substrate shown in FIG. 2I is preferred over the hybrid substrate shown in FIG. 2G because both device areas are SOI like and the upper most device regions contain an ultra thin semiconductor layer 16 or 28, as compared to FIG. 2G.

Figure 4:
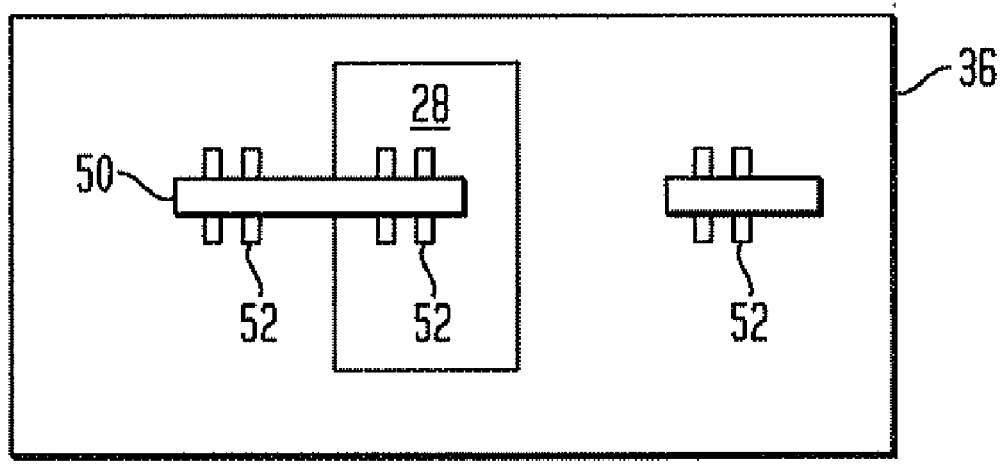
FIG. 4 is a pictorial representation (through a top down view) illustrating the structure that is formed after fabricating planar and/or multiple-gate MOSFETs on the hybrid substrate of the present invention.

FIG. 4 shows the resultant structure that is formed after fabricating a planar and/or multiple-gate MOSFET, such as a tri-gate MOSFET and/or FinFET, on the hybrid substrate of the present invention. In FIG. 4 reference numeral 50 denotes the gate of each device and reference numeral 52 denotes the planar and/or multiple-gated device. In accordance with the present invention, the n-devices are formed on the semiconductor surface (16, 28) that has a (100) surface orientation and the p-devices are formed on the semiconductor surface (16, 28) that has a (110) surface orientation. Moreover, the gates for both the nFET and pFET are orientated toward the same direction. The hybrid orientation substrate has been prepared such that the gate of the n-devices is oriented to the <100> direction such that all channels are on (100) surfaces (on the top and the two sides of the Fin) and the gate of the p-devices is oriented to the <110> direction such that all channels are on (110) surfaces (on the top and the two sides of the Fin). With this process, it is possible to build high mobility devices such that the all the device channels are on high mobility planes and gates are oriented in the same direction. The planar and/or multiple-gate MOSFETs are fabricated using techniques that are well known to those skilled in the art.

For example, the various devices can be fabricated using the process disclosed in co-assigned U.S. patent application Ser. No. 10/604,097, filed Jun. 26, 2003, the entire content of which is incorporated herein by reference. The process described in the '097 application which can be used herein includes providing at least one patterned hardmask located in a FinFET region of the hybrid substrate and at least one patterned hardmask located in a tri-gate region of the hybrid substrate; protecting the tri-gate region and trimming the at least one patterned hard mask in said FinFET region; etching exposed portions of the top semiconductor layers 16, 28 that are not protected with the hardmasks stopping on a surface of the buried insulating 14 or buried oxide region 34, said etching defining a FinFET active device region and a tri-gate active device region, said FinFET active device region being perpendicular to the tri-gate active device region; protecting the FinFET active device region and thinning the tri-gate active device region so that the tri-gate device region has a height that is less than the height of the FinFET active device region; forming a gate dielectric on each exposed vertical surface of the FinFET active device region, while forming a gate dielectric on an exposed horizontal surface of the tri-gate device region; and forming a patterned gate electrode on each exposed surface of the gate dielectric.

The various materials and components present in the FinFET and the tri-gate device regions are also well known therefore a detailed discussion concerning the same is not provided herein. For example, each device includes a gate dielectric that may comprise an oxide, nitride, oxynitride or any combination thereof. Preferably, the gate dielectric is an oxide such as, but not limited to: $SiO_2$, $Al_2O_2$, perovskite oxides, or other like oxides. The gate dielectric can be formed utilizing a thermal oxidation, nitridation, or oxynitridation process. Note that the FinFET active device will contain two gate dielectrics formed on exposed vertical surfaces of one of the semiconductor layers, i.e., 16 or 38, while the multiple-gated device can have multiple gate dielectrics, as appropriate.

A gate conductor is also present in each type of device. The gate conductor can be formed utilizing a conventional deposition process such as, for example, chemical vapor deposition (CVD), plasma-assisted CVD, evaporation, sputtering, chemical solution deposition, or atomic layer deposition. The gate conductor may comprise poly-Si; an elemental metal such as W; an alloy containing one or more elemental metals; a silicide; or a stack combination thereof, such as, for example, poly-Si/W or silicide.

A substrate structure and a method of fabricating the same has been described to make planar and/or multiple-gated MOSFETs, such as FinFETS and tri-gate MOSFETs, in which all of the channels are oriented on high mobility surfaces with the gate at same direction.

Various implants can be performed either before or after gate formation including, for example, well implants, source/drain extension implants, halo implants, source/drain diffusion implants, gate implants and the like. Moreover, the structures of the present invention can also contain raised/source drain regions that are formed by conventional means. Further processing such as, for example, BEOL (back-end-of-line) processing, can also be employed at this point of the present invention.

While the present invention has been particularly shown and described with respect to preferred embodiments, it will be understood by those skilled in the art that the foregoing and other changes in forms and details may be made without departing from the spirit and scope of the present invention.

It is therefore intended that the present invention not be limited to the exact forms and details described and illustrated, but fall within the scope of the appended claims.

We claim:

1. A hybrid substrate comprising:
   an upper surface comprising a second semiconductor layer and an epitaxial semiconductor layer, wherein said second semiconductor layer has a second crystallographic orientation and the epitaxial semiconductor layer has a first crystallographic orientation that differs from the second crystallographic orientation, said first and second crystallographic orientations provide optimal carrier mobility for a specific semiconductor device;
   a liner or spacer separating at least said second semiconductor layer and said epitaxial semiconductor layer;
   an insulating layer located beneath said second semiconductor layer; and
   a first semiconductor layer located beneath said insulating layer and said epitaxial semiconductor layer, wherein said first semiconductor layer is in direct contact with a lower portion of the epitaxial semiconductor layer, has a crystallographic orientation that is the same as the epitaxial semiconductor layer, and said first semiconductor layer and said second semiconductor layer each contain a wafer flat that is aligned to each other.

2. The hybrid substrate of claim 1 wherein said first semiconductor layer and said second semiconductor layer are comprised of Si, SiC, SiGe, SiGeC, Ge, Ge alloys, GaAs, InAs, InP, a silicon-on-insulator (SOI) layer or other III/V and II/VI compound semiconductors.

3. The hybrid substrate of claim 2 wherein said first semiconductor layer and said second semiconductor layer are comprised of Si.

4. The hybrid substrate of claim 1 wherein said first semiconductor layer is comprised of Si and said first crystallographic orientation is (110) with said wafer flat in the <110> direction and said second semiconductor layer comprises Si and said second crystallographic orientation is (100) with said wafer flat in the <100> direction.

5. The hybrid substrate of claim 1 wherein said first semiconductor layer is comprised of Si and said first crystallographic orientation is (100) with said wafer flat in the <100> direction and said second semiconductor layer comprises Si and said second crystallographic orientation is (110) with said wafer flat in the <110> direction.

6. The hybrid substrate of claim 1 wherein said epitaxial semiconductor layer comprises a Si-containing semiconductor.

7. The hybrid substrate of claim 6 wherein said Si-containing semiconductor comprises Si, strained Si, SiC, SiGeC or combinations thereof.

8. The hybrid substrate of claim 1 wherein said epitaxial semiconductor layer comprises Si with a (100) crystallographic orientation.

9. The hybrid substrate of claim 1 wherein said epitaxial semiconductor layer comprises Si with a (110) crystallographic orientation.

10. The hybrid substrate of claim 1 wherein said liner or spacer comprises an oxide, nitride, oxynitride or any combination thereof.

11. The hybrid substrate of claim 1 wherein said insulating layer comprises an oxide, nitride, oxynitride or combination thereof.

12. The hybrid substrate of claim 1 further comprises a buried oxide region within at least one of said second semiconductor layer or said epitaxial semiconductor layer.

13. The hybrid substrate of claim 1 wherein said upper surface comprises at least two device regions.

14. The hybrid substrate of claim 1 wherein said upper surface comprises a (100) crystallographic orientation and a (110) crystallographic orientation.

15. The hybrid substrate of claim 14 wherein said upper surface of said (100) crystallographic orientation comprises a n-type planar or multiple-gate MOSFET device, and said surface of said (110) crystallographic orientation comprises a p-type planar or multiple-gate MOSFET device.

16. A high-mobility structure comprising:
   a hybrid substrate containing an upper surface comprising a second semiconductor layer and an epitaxial semiconductor layer, wherein said second semiconductor layer has a second crystallographic orientation and the epitaxial semiconductor layer has a first crystallographic orientation that differs from the second crystallographic orientation, said first and second crystallographic orientations provide optimal carrier mobility for a specific semiconductor device; a liner or spacer separating at least said second semiconductor layer and said epitaxial semiconductor layer; an insulating layer located beneath said second semiconductor layer; a first semiconductor layer located beneath said insulating layer and said epitaxial semiconductor layer, wherein said first semiconductor layer is in direct contact with a lower portion of the epitaxial semiconductor layer, and has a crystallographic orientation that is the same as the epitaxial semiconductor layer; and
   at least one planar or multiple-gate MOSFET device present on both said second semiconductor layer and said epitaxial semiconductor layer, wherein said devices have gates that are oriented in the same direction and are present on a surface that is optimal for said MOSFET device.

17. The structure of claim 16 wherein said first semiconductor layer and said second semiconductor layer are comprised of Si, SiC, SiGe, SiGeC, Ge, Ge alloys, GaAs, InAs, InP, a silicon-on-insulator (SOI) layer or other III/v and II/VI compound semiconductors.

18. The structure of claim 17 wherein said first semiconductor layer and said second semiconductor layer are comprised of Si.

19. The structure of claim 16 wherein said first semiconductor layer is comprised of Si and said first crystallographic orientation is (110) with said wafer flat in the <110> direction and said second semiconductor layer comprises Si and a second crystallographic orientation is (100) with a wafer flat in the <100> direction.

20. The structure of claim 16 wherein said first semiconductor layer is comprised of Si and said first crystallographic orientation is (100) with a wafer flat in the <100> direction and said second semiconductor layer comprises Si and said second crystallographic orientation is (110) with a wafer flat in the <110> direction.

21. The structure of claim 16 wherein said epitaxial semiconductor layer comprises a Si-containing semiconductor.

22. The structure of claim 21 wherein said Si-containing semiconductor comprises Si, strained Si, SiC, SiGeC or combinations thereof.

23. The structure of claim 16 wherein said epitaxial semiconductor layer comprises Si with a (100) crystallographic orientation.

24. The structure of claim 16 wherein said epitaxial semiconductor layer comprises Si with a (110) crystallographic orientation.

25. The structure of claim 16 wherein said liner or spacer comprises an oxide, nitride, oxynitride or any combination thereof.

26. The structure of claim 16 wherein said insulating layer comprises an oxide, nitride, oxynitride or combination thereof.

27. The structure of claim 16 further comprises a buried oxide region within at least one of said second semiconductor layer or said epitaxial semiconductor layer.

28. The structure of claim 16 wherein said upper surface comprises at least two device regions.

29. The structure of claim 16 wherein said upper surface comprises a (100) crystallographic orientation and a (110) crystallographic orientation.

30. The structure of claim 29 wherein said upper surface of said (100) crystallographic orientation comprises a n-type planar or multiple-gate MOSFET device, and said surface of said (110) crystallographic orientation comprises a p-type planar or multiple-gate MOSFET device.

* * * * *